(12) United States Patent
Okayasu

(10) Patent No.: US 6,598,212 B2
(45) Date of Patent: Jul. 22, 2003

(54) DELAY CIRCUIT, TESTING APPARATUS, AND CAPACITOR

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/942,355

(22) Filed: Aug. 29, 2001

(65) Prior Publication Data

US 2002/0026622 A1 Feb. 28, 2002

(30) Foreign Application Priority Data

Aug. 29, 2000  (JP) ........................................ 2000-259446

(51) Int. Cl.⁷ ............................................... G06F 17/50

(52) U.S. Cl. .................................... 716/4; 716/1; 716/6

(58) Field of Search ..................... 716/1, 4–6; 327/161, 327/182, 392–393

(56) References Cited

U.S. PATENT DOCUMENTS 5,297,056 A  *  3/1994  Lee et al. ...................... 716/1
6,209,122 B1 *  3/2001  Jyu et al. ...................... 716/6

FOREIGN PATENT DOCUMENTS

DE  69308978 T2  9/1997  ............. H03K/5/13
DE  10005620 A1  8/2001  ............. H03K/5/13

* cited by examiner

*Primary Examiner*—Matthew Smith
*Assistant Examiner*—Paul Dinh
(74) *Attorney, Agent, or Firm*—Rosenthal & Osha L.L.P.

(57) ABSTRACT

A delay circuit having an adjustable delay resolution is provided. The delay circuit has a path through which a signal transmits, a field effect transistor whose source region and drain region are connected to the path, and an impressed voltage control unit which controls a voltage to be impressed to the gate electrode of the field effect transistor. The impressed voltage control unit may be a digital analog converter.

1 Claim, 4 Drawing Sheets (a)

(b)

DELAY CIRCUIT, TESTING APPARATUS, AND CAPACITOR

This patent application claims priority based on a Japanese patent application, 2000-259446 filed on Aug. 29, 2000, the contents of which are incorporated herein by reference.

BACKGROUND OF THE INVENTION

1. Field of the Invention

The present invention relates to a delay circuit, a testing apparatus, and a capacitor. More particularly, the present invention relates to a delay circuit which generates a desired delay time by changing the junction capacitance of a field effect transistor.

2. Description of the Related Art

FIG. 1 shows a conventional delay circuit 300. The conventional delay circuit 300 has a first buffer 302 which shapes the wave form of an input signal and then outputs the resultant shaped signal, a path 306 through which the output signal transmits, a first capacitor 312 which adds capacitance C to the path 306, a second capacitor 314 which adds capacitance C' to the path 306, a first switching device 308 which electrically connects or disconnects the path 306 with the first capacitor 312, a second switching device 310 which electrically connects or disconnects the path 306 with the second capacitor 314, and a second buffer 304 which shapes the wave form of the signal that has transmitted through the path 306 and outputs the resultant shaped signal. A control unit not shown in the drawing controls the switching devices 308 and 310 so as to change the capacitance added to the path 306. In this way, the control unit not shown in the drawing delays the signal that transmits the path 306 by a desired length of time.

The conventional delay circuit 300 achieves a fine delay resolution by selectively adding either the capacitance C or the capacitance C' which differs slightly from the capacitance C. However, in the conventional delay circuit 300, the channel capacitance of the first switching device 308 differs from that of the second switching device 310, and the wire capacitance of the wire which connects the first capacitor 312 with the path 306 differs from the wire capacitance of the wire which connects the second capacitor 314 with the path 306. These capacitance differences influence the capacitance added to the path 306. As a result, the desired fine delay resolution which is designed to be achieved by utilizing the fine difference between the capacitance C and the capacitance C' has been very difficult.

SUMMARY OF THE INVENTION

Therefore, it is an object of the present invention to provide a delay circuit, a testing apparatus, and a capacitor which overcome the above-described problem. This object is achieved by combinations described in the independent claims. The dependent claims define further advantageous and exemplary combinations of the present invention.

According to the first aspect of the present invention, a delay circuit having a buffer which shapes the wave form of an input signal and outputs a shaped signal, a field effect transistor which has a source region, a drain region, a gate electrode, and a substrate on which the source region and the drain region are installed, and an impressed voltage control unit which impresses a desired voltage to the gate electrode is provided. The source region and the drain region are connected to a path through which an output signal transmits. The desired voltage is then impressed to the gate electrode so as to control the capacitance between the source region, the drain region, and the substrate. In this way, the signal is delayed by a desired length of time.

Moreover, it is preferable that the delay circuit have several field effect transistors connected to the path such that the impressed voltage control unit controls the capacitance added to the path by impressing a desired voltage to the gate electrode of each of the several field effect transistors. It is preferable that the impressed voltage control unit have a digital analog converter. Moreover, the delay circuit may further have a capacitor having a prescribed capacitance connected to the path.

According to the second aspect of the present invention, a testing apparatus which supplies a test signal to an electronic device and tests the electronic device is provided. This testing apparatus has a pattern generating unit which generates a pattern that corresponds to the test signal, a wave form shaping unit having a delay circuit for generating a delay signal that corresponds to the operation characteristic of the electronic device, which shapes the pattern and outputs the test signal, a signal input output unit which supplies the test signal to the electronic device and receives an output signal output from the electronic device, and a judging unit which judges whether the electronic device is acceptable or not based on the output signal. The delay circuit has a buffer which shapes the wave form of an input signal and outputs a shaped signal, a field effect transistor having a source region, a drain region, a gate electrode, and a substrate on which the source region and the drain region are installed, and an impressed voltage control unit which impresses a desired voltage to the gate electrode. The source region and the drain region are connected to a path through which an output signal transmits. The delay signal is generated controlling the capacitance between the source region, the drain region, and the substrate by impressing the desired voltage to the gate electrode.

According to the third aspect of the present invention, a capacitor having a capacitance between a first terminal and a second terminal is provided. This capacitor has a field effect transistor having a source region, a drain region, a gate electrode, and a substrate on which the source region and the drain region are installed, and an impressed voltage control unit which controls the capacitance between the first terminal and the second terminal by impressing one of three or more predetermined voltages to the gate electrode. The source region and the drain region are connected to the first terminal, and the substrate is connected to the second terminal.

This summary of the invention does not necessarily describe all necessary features of the present invention. The present invention may also be a sub-combination of the above-described features. The above and other features and advantages of the present invention will become more apparent from the following description of embodiments taken in conjunction with the accompanying drawings.

DETAILED DESCRIPTION OF THE INVENTION

In what follows, the present invention will be explained with embodiments of the present invention. However, the following embodiments do not restrict the scope of the invention described in the claims. Moreover, not all the combinations of the characteristics of the present invention described in the embodiments are essential to the problem solving means by the present invention.

Figure 1:
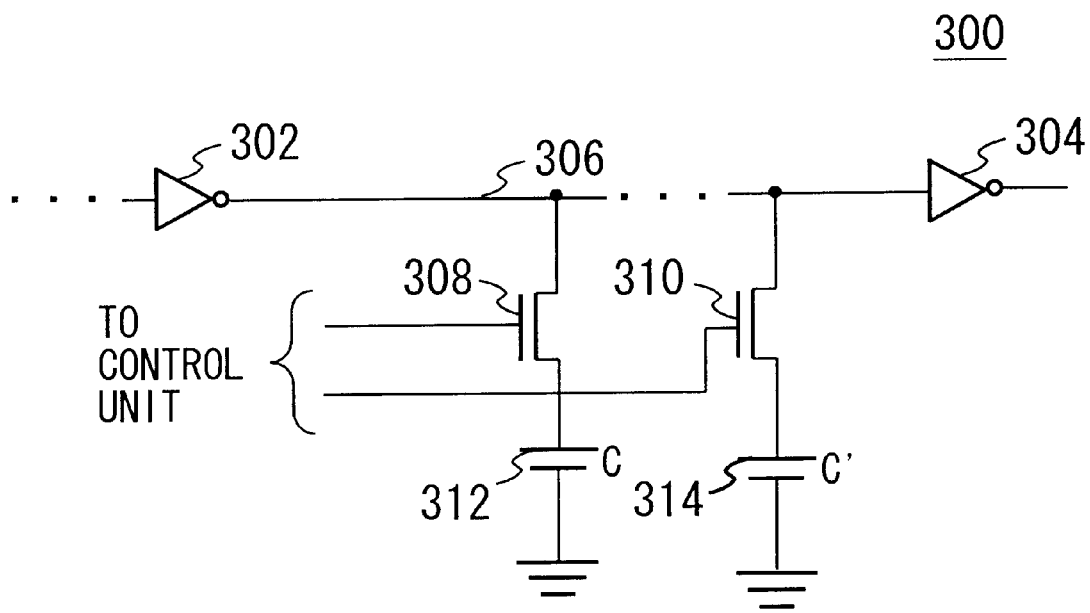
FIG. 1 shows a conventional delay circuit 300.
Figure 2:
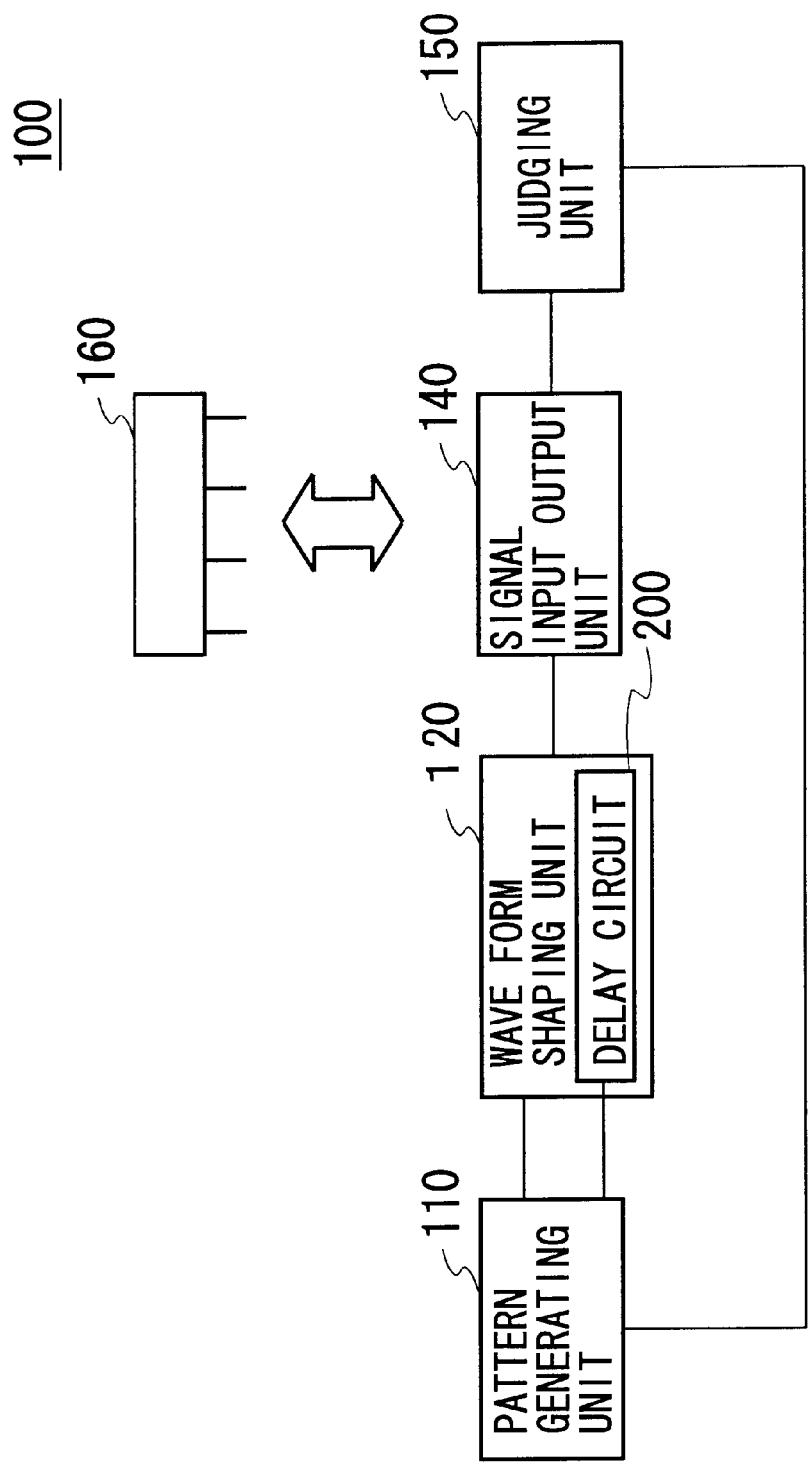
FIG. 2 shows a testing apparatus 100 for testing an electronic device according to an embodiment of the present invention.

FIG. 2 shows a testing apparatus 100 according to an embodiment of the present invention which tests an electronic device. The testing apparatus 100 has a pattern generating unit 110 which generates pattern data of a test signal to be input to an electronic device 160 to be tested, a wave form shaping unit 120 which shapes the pattern data, a signal input output unit 140 which supplies the shaped pattern data to the electronic device 160 and receives a signal output from the electronic device 160, and a judging unit 150 which judges whether the electronic device 160 is satisfactory or not. Moreover, the wave form shaping unit 120 has a delay circuit 200. This delay circuit 200 has a field effect transistor and an impressed voltage control unit. The field effect transistor has a source region S, a drain region D, a gate electrode G, and a substrate B on which the source region S and the drain region D are installed (Note FIG. 3(A)). The source region S and the drain region D are electrically connected to a path through which the signal input to the wave form shaping unit 120 transmits. The impressed voltage control unit impresses a desired voltage to the gate electrode G.

The pattern generating unit 110 generates a pattern data, which is a test pattern to be input to the electronic device 160, and an expectation value data which the electronic device 160 should output based on the received input pattern data. Moreover, the pattern generating unit 110 outputs not only the pattern data to the wave form shaping unit 120 but also the expectation value, which is to be output from the electronic device 160, to the judging unit 150. In addition, the pattern generating unit 110 outputs a timing set signal, which designates the generation of a delay clock signal having a prescribed delay amount that corresponds to the operation characteristics of the electronic device 160, to the delay circuit 200.

The delay circuit 200 generates a delay signal having a delay amount that is designated by the timing set signal. The wave form shaping unit 120 shapes the pattern data based on the delay signal supplied from the delay circuit 200, and outputs the shaped pattern data, which corresponds to the operation characteristics of the electronic device 160, to the signal input output unit 140. The electronic device 160 outputs output values that correspond to the shaped pattern data to the judging unit 150 via the signal input output unit 140. The judging unit 150 compares the output values with the expectation values supplied from the pattern generating unit 110 and judges whether the electronic device 160 is acceptable or not.

Figure 3:
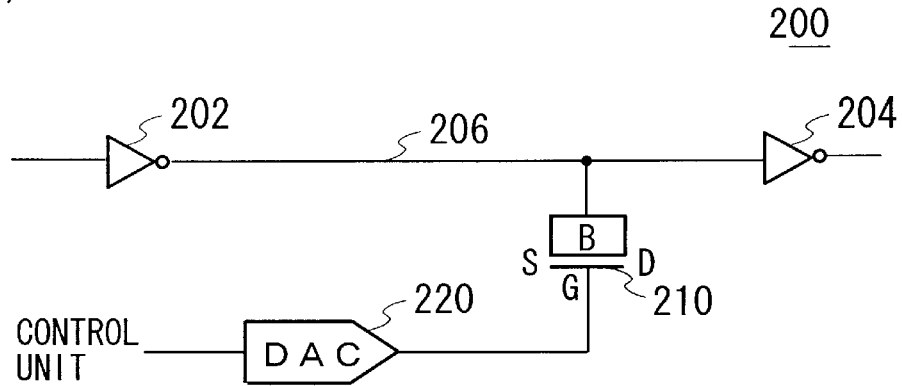
FIG. 3 shows a delay circuit 200 according to an embodiment of the present invention.
Figure 3:
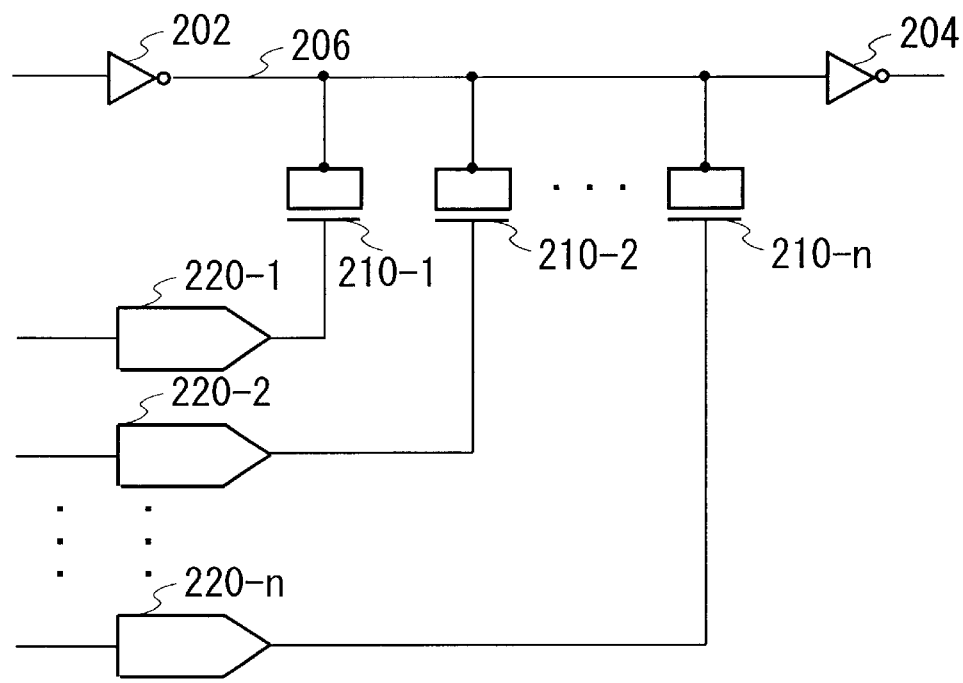

FIG. 3 shows a delay circuit 200 according to an embodiment of the present invention. In FIG. 3(a), the delay circuit 200 has a first buffer 202, a field effect transistor (FET) 210, a second buffer 204, an impressed voltage control unit 220, and a path 206 which electrically connects between the first buffer 202, the second buffer 204, and the FET 210. The first buffer 202 and the second buffer 204 shape the wave form of an input signal and output the resultant shaped signal. In this embodiment, each of the first buffer 202 and the second buffer 204 has an inverter.

The FET 210 has a source region S, a drain D, a gate electrode G, and a substrate B on which the source region S and the drain D are constructed. The source region S and the drain D are electrically connected to the path 206 through which a signal output from the first buffer 202 transmits. The FET 210 may be either a p-channel FET or n-channel FET. Moreover, the FET 210 may be an enhancement type FET or a depression type FET. It is preferable that the substrate region B be held at a prescribed voltage value. In this embodiment, the substrate region B is grounded. A prescribed capacitance, which is a pn-junction capacitance, is formed between the source region S, the drain region D, and the substrate region B, corresponding to the area of the pn-junction region formed by the source region S, the drain region D, and the substrate region B, and the thickness of the depletion layer formed in the pn-junction region. Therefore, in the delay circuit 200 according to this embodiment, the FET 210 is connected to a first terminal at which the source region S and the drain region D are connected to the impressed voltage control unit 220. The FET 210, together with a second terminal, at which the substrate B is held at a prescribed voltage, form a capacitor.

The impressed voltage control unit 220 impresses a voltage having a desired value to the gate electrode G of the FET 210. The impressed voltage control unit 220 may be designed to generate three or more distinct voltage values so as to select one of the three or more distinct voltage values and then impress the voltage having the selected value to the gate electrode G. Moreover, the value of the voltage which the impressed voltage control unit 220 impresses to the gate electrode G may be between the voltage value at which the signal that transmits through the path 206 represents an H-logic (VDD) and the voltage value at which the signal that transmits through the path 206 represents an L-logic (VSS). In this embodiment, the impressed voltage control unit 220 has a digital analog converter (DAC), and impresses a desired voltage to the gate electrode G based on an instruction supplied from a control unit not shown in the drawing. Moreover, the capacitance formed between the source region S, the drain region D, and the substrate region B depends on the electric potential of the gate electrode G with respect to the electric potential of the substrate region B which is a reference electric potential. The impressed voltage control unit 220 controls the capacitance, which is formed between the source region S, the drain region D, and the substrate region B, by controlling the electric potential of the gate electrode G with respect to the electric potential of the substrate region B.

The signal output from the first buffer 202 transmits through the path 206, is delayed by the length of time that corresponds to the capacitance formed between the source region S, the drain region D, and the substrate region B, and is input to the second buffer 204. The second buffer 204 then inverts the wave form of the delayed signal, shapes the wave form of the inverted delayed signal, and outputs the shaped inverted delayed signal.

The delay circuit 200 according to this embodiment can control the capacitance of the source region S and the drain region D with respect to the substrate region B by controlling the value of the voltage to be impressed to the gate electrode G of the FET 210. Therefore, the delay circuit 200 according to this embodiment can control the capacitance added to the path 206. As a result, the delay circuit 200 according to this embodiment can generate a delay of any desired amount simply by controlling the capacitance added to the path without having a switching device such as a transfer gate or a switch between the capacitor for generating a delay amount and the path through which signals transmit. Moreover, even in the case in which the delay circuit 200 has a switching device between the capacitor for generating a delay amount and the path through which signals transmit, the delay circuit 200 can correct the variance of delay amounts caused by the differences in the characteristics of the wires and switching devices due to processing variance in the manufacturing processes of the wires and switching devices, simply by controlling the capacitance added to the path.

As shown in FIG. 3(b), the delay circuit 200 may have several FETs 210-1 through 210-n, such that each FET 210-k has a source region S-k and a drain region D-k that are connected to the path 206, where $1 \leq k \leq n$. Moreover, it is desirable that the delay circuit 200 further have several impressed voltage control units 220-1 through 220-n for impressing voltages of desired values to the gate electrodes G-1 through G-n of the FETs 210-1 through 210-n, respectively. The impressed voltage control units 220-1 through 220-n control the values of the voltages to be impressed to the gate electrodes G-1 through G-n of the FETs 210-1 through 210-n, respectively, based on an instruction supplied from a control unit not shown in the drawing so as to delay a signal that transmits through the path 206 by a desired length of time.

Figure 4:
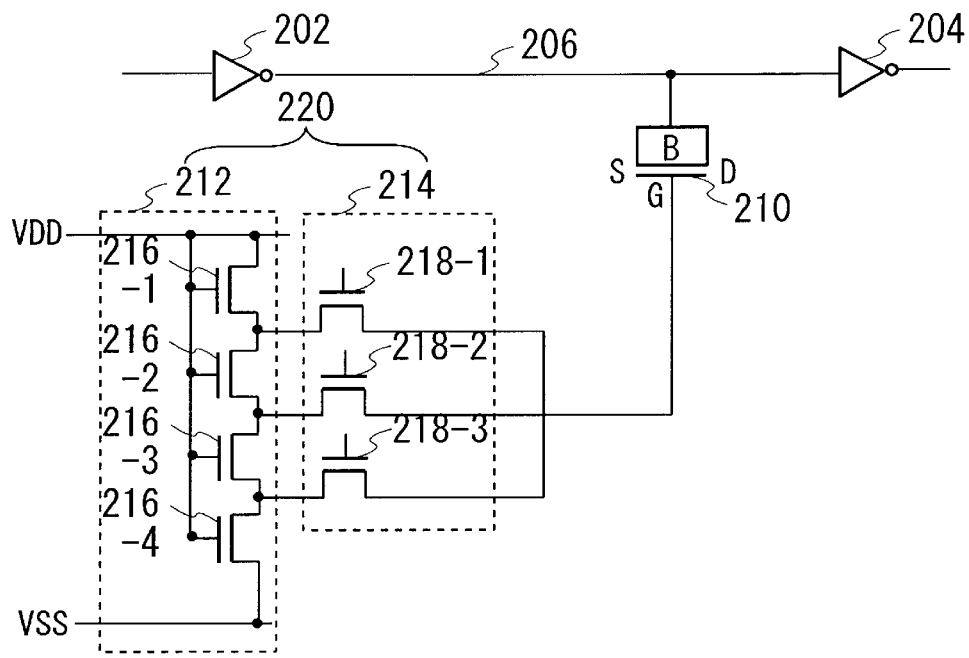
FIG. 4 shows another embodiment of the delay circuit 200.
Figure 4:
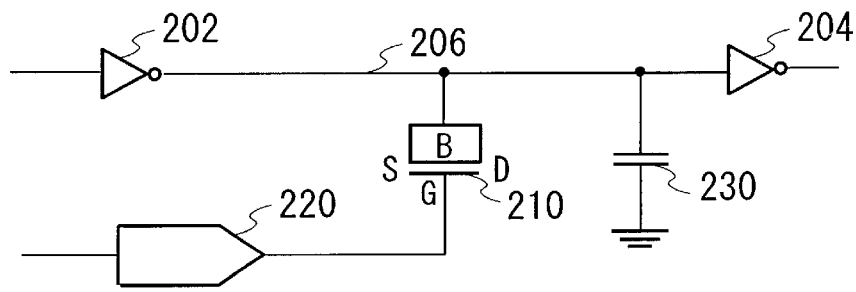

FIG. 4 shows another embodiment of the delay circuit 200. FIG. 4(a) shows an exemplary impressed voltage control unit 220 which generates three distinct voltage values. In FIG. 4(a), the impressed voltage control unit 220 has a voltage generating unit 212 which generates voltages of three values and a voltage selecting unit 214 which selects one of the three distinct voltage values generated by the voltage generating unit 212. The voltage generating unit 212 has four connected resistors. In the voltage generating unit 212, a voltage having a first prescribed value is impressed to one end of the four serially connected resistors and another voltage having a second prescribed value is impressed to the other end of the four serially connected resistors. It is preferable that the voltage generating unit 212 generate three voltages of distinct values in such a manner that each of these distinct values is between the value of the voltage impressed to the one end of the serially connected resistors and the value of the voltage impressed to the other end of the serially connected resistors. In this embodiment, the voltage generating unit 212 has serially connected FETs 216-1 through 216-4. In this voltage generating unit 212, a voltage VDD is impressed to the source region or drain region of the first FET 216-1 and the gate electrode of the FET 2161, and a voltage VSS is impressed to the drain region or source region of the last FET 216-4. Due to the channel resistance of each of the serially connected FETs 216-1 through 216-4, when the voltages VDD and VSS are impressed in this way, the values of the voltages at the nodes N-1, N-2, and N-3, which connect the source region of one FET with the drain region of the adjacent FET, on the other side of the series, become all distinct and lie between the value of VDD and the value of VSS. In this way, three voltages of distinct values which lie between the value of VDD and the value of VSS are generated. In order to generate n voltages of distinct values which lie between the value of VDD and the value of VSS, where $n \geq 4$, n+1 serially connected FETs 216-1 through 216-(n+1) are installed in the voltage generating unit. In this case, a voltage VDD is impressed to the source region or drain region of the first FET 216-1 and the gate electrode of the FET 216-1, and a voltage VSS is impressed to the drain region or source region of the last FET 216-(n+1).

In the case in which three voltages of distinct values are generated, the voltage selecting unit 214 has three FETs 218-1 through 218-3, which serve as switching devices. It is preferable that the source region or drain region of each of the FETs 218-1 through 218-3 be connected to the nodes N-1, N-2, and N-3 in the voltage generating unit 212, respectively. The control unit not shown in the drawing impresses a voltage to the gate electrode of one of the FET's 218-1 through 218-3 to impress a voltage of prescribed value to the gate electrode G of the FET 210. In the case of generating n voltages of distinct values which lie between the value of VDD and the value of VSS, where $n \geq 4$, the voltage selecting unit 214 has n FETs 218-1 through 218-n, which serve as switching devices. It is preferable that the source region or drain region of each of the FETs 218-1 through 218-n be connected to the nodes N-1 through N-n in the voltage generating unit 212, respectively. In this case, the control unit not shown in the drawing impresses a voltage to the gate electrode of one of the FET's 218-1 through 218-n to impress a voltage of prescribed value to the gate electrode G of the FET 210. In this way, the signal which transmits through the path 206 is delayed by a desired length of time.

As shown in FIG. 4(b), the delay circuit 200 may have an additional capacitor 230 having a prescribed capacitance. It is preferable that the capacitor 230 have a fixed capacitance. It is preferable that the fixed capacitance of the capacitor 230 have a prescribed ratio with respect to the change in the capacitance of the FET 210 that is added to the path 206.

As is clear from the description provided above, according to the present invention, a desired delay amount can be generated.

Although the present invention has been described by way of exemplary embodiments, it should be understood that many changes and substitutions may be made by those skilled in the art without departing from the spirit and the scope of the present invention which is defined only by the appended claims.

What is claimed is:

1. A testing apparatus which supplies a test signal to an electronic device and tests said electronic device, comprising:

a pattern generating unit which generates a pattern that corresponds to said test signal;

a wave form shaping unit having a delay circuit for generating a delay signal that corresponds to an operation characteristic of said electronic device, which shapes said pattern and outputs said test signal;

a signal input output unit which supplies said test signal to said electronic device and receives an output signal from said electronic device; and a judging unit which judges whether said electronic device is acceptable or not based on said output signal, wherein said delay circuit has:

a buffer which shapes a wave form of an input signal and outputs a shaped signal;

a field effect transistor including a source region, a drain region, a gate electrode, and a substrate on which said source region and said drain region are installed; and an impressed voltage control unit which impresses a desired voltage to said gate electrode, and wherein said source region and said drain region are connected to a path through which an output signal transmits, and said delay signal is generated by controlling a capacitance between said source region, said drain region, and said substrate by impressing said desired voltage to said gate electrode.

* * * * *